(12) United States Patent
Lee et al.

(10) Patent No.: US 12,324,107 B2
(45) Date of Patent: Jun. 3, 2025

(54) CIRCUIT BOARD AND A DISPLAY DEVICE INCLUDING THE SAME

(71) Applicant: Samsung Display Co., Ltd., Yongin-si (KR)

(72) Inventors: Hyo-Chul Lee, Yongin-si (KR); Younyee Kang, Asan-si (KR); Ji-Won Kim, Hwaseong-si (KR); Seungin Baek, Seongnam-si (KR); In Soo Wang, Suwon-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 284 days.

(21) Appl. No.: 18/126,605

(22) Filed: Mar. 27, 2023

(65) Prior Publication Data

US 2024/0015897 A1     Jan. 11, 2024

(30) Foreign Application Priority Data

Jul. 11, 2022 (KR) .................. 10-2022-0084842

(51) Int. Cl.
| | |
|---|---|
| *H05K 1/14* | (2006.01) |
| *H05K 1/18* | (2006.01) |
| *H05K 5/00* | (2006.01) |

(52) U.S. Cl.
CPC .......... *H05K 5/0018* (2022.08); *H05K 1/189* (2013.01); *H05K 5/0086* (2013.01); *H05K 2201/09327* (2013.01); *H05K 2201/10128* (2013.01)

(58) Field of Classification Search
CPC .... H05K 5/0018; H05K 1/189; H05K 5/0086; H05K 2201/09327; H05K 2201/10128; H05K 1/147
See application file for complete search history.

(56) References Cited

U.S. PATENT DOCUMENTS 9,414,504 B2 * 8/2016 Joo ............... G02B 6/0083

FOREIGN PATENT DOCUMENTS

| CN | 212873154 U | 4/2021 |
|---|---|---|
| KR | 1020180000813 A | 1/2018 |
| KR | 1020210039149 A | 4/2021 |
| KR | 1020210073805 A | 6/2021 |

* cited by examiner

*Primary Examiner* — Sherman Ng
(74) *Attorney, Agent, or Firm* — CANTOR COLBURN LLP

(57) ABSTRACT

A circuit board includes a first body part, a second body part and a connection part. The first body part includes a first contact surface and has a multi-layered structure. The second body part includes a second contact surface, has a multi-layered structure, and includes a first signal line spaced apart from the second contact surface. The connection part includes a third contact surface between the first contact surface and the second contact surface, and connects the first body part and the second body part to each other.

20 Claims, 8 Drawing Sheets

CIRCUIT BOARD AND A DISPLAY DEVICE INCLUDING THE SAME

This application claims priority to Korean Patent Application No. 10-2022-0084842, filed on Jul. 11, 2022, and all the benefits accruing therefrom under 35 U.S.C. § 119, the content of which in its entirety is herein incorporated by reference.

BACKGROUND

1. Field

Embodiments provide generally to a circuit board. More particularly, Embodiments provide generally to a circuit board of a display device and a display device including the circuit board.

2. Description of the Related Art

Recently, as the size of a display panel for a mobile device or a portable electronic device increases, the battery capacity also increases. As the battery capacity increases, the region occupied by the battery increases, such that the region occupied by other components may relatively decrease.

SUMMARY

In a mobile device, in which the size of the circuit board to secure battery space is reduced, may result in insufficient line space. Accordingly, a design technique for arranging line in a narrow space is becoming important.

Embodiments provide a circuit board.

Embodiments provide a display device including the circuit board.

A circuit board according to an embodiment includes a first body part, a second body part, and a connection part. In such an embodiment, the first body part includes a first contact surface and has a multi-layered structure. In such an embodiment, the second body part includes a second contact surface, has a multi-layered structure, and includes a first signal line spaced apart from the second contact surface. In such an embodiment, the connection part includes a third contact surface between the first contact surface and the second contact surface, and connects the first body part and the second body part to each other.

In an embodiment, the second body part may further include a panel signal line, a second signal line, and a ground layer. In such an embodiment, the panel signal line may be disposed adjacent to the second contact surface. In such an embodiment, the second signal line may be disposed on the panel signal line. In such an embodiment, the ground layer may be disposed on the second signal line.

In an embodiment, the second signal line may be disposed between the panel signal line and the ground layer, and the ground layer may be disposed between the first signal line and the second signal line.

In an embodiment, the second signal line may be a line, to which a frame start signal is applied.

In an embodiment, the first signal line may be a common voltage line, to which a common voltage is applied, or a driving voltage line, to which a driving voltage is applied.

In an embodiment, the second body part may further include a panel signal line, a ground layer, and a second signal line. In such an embodiment, the panel signal line may be disposed adjacent to the second contact surface. In such an embodiment, the ground layer may be disposed on the panel signal line. In such an embodiment, the second signal line may be disposed on the ground layer.

In an embodiment, the second signal line may be disposed between the first signal line and the ground layer.

In an embodiment, the first signal line may be a common voltage line, to which a common voltage is applied, or a driving voltage line, to which a driving voltage is applied.

In an embodiment, the second signal line may be a common voltage line, to which a common voltage is applied, or a driving voltage line, to which a driving voltage is applied.

In an embodiment, in a state where the connection part is bent, the first contact surface and the second contact surface may face each other.

A display device according to an embodiment includes a display panel and a circuit board. In such an embodiment, the display panel includes a first surface and a second surface. In such an embodiment, the second surface be opposite to the first surface and displays an image. In such an embodiment, the circuit board includes a first body part, a second body part, and a connection part. In such an embodiment, the first body part includes a first contact surface in contact with the first surface of the display panel. In such an embodiment, the second body part includes a second contact surface in contact with the second surface of the display panel, has a multi-layered structure, and includes a first signal line spaced apart from the second contact surface. In such an embodiment, the connection part includes a third contact surface between the first contact surface and the second contact surface, and connects the first body part and the second body part to each other.

In an embodiment, the second body part may further include a panel signal line, a second signal line, and a ground layer. In such an embodiment, the panel signal line may be disposed adjacent to the second contact surface. In such an embodiment, the second signal line may be disposed on the panel signal line. In such an embodiment, the ground layer may be disposed on the second signal line.

In an embodiment, the second signal lines may be disposed between the panel signal line and the ground layer, and the ground layer may be disposed between the first signal line and the second signal line.

In an embodiment, the second signal line may be a line, to which a frame start signal is applied.

In an embodiment, the first signal line may be a common voltage line, to which a common voltage is applied, or a driving voltage line, to which a driving voltage is applied.

In an embodiment, the second body part may further include a panel signal line, a ground layer, and a second signal line. In such an embodiment, the panel signal line may be disposed adjacent to the second contact surface. In such an embodiment, the ground layer may be disposed between the panel signal line and the first signal line. In such an embodiment, the second signal line may be disposed between the ground layer and the first signal line.

In an embodiment, the first signal line may be a common voltage line, to which a common voltage is applied, or a driving voltage line, to which a driving voltage is applied.

In an embodiment, the second signal line may be a common voltage line, to which a common voltage is applied, or a driving voltage line, to which a driving voltage is applied.

In an embodiment, a display device may further include a battery disposed adjacent to the first body part of the circuit board on the first surface of the display panel, where the battery may provide power to the display panel.

In an embodiment, the circuit board may be a flexible printed circuit board (FPCB).

According to embodiments of the invention, the circuit board may include a first body part, a second body part, and a connection part. In such embodiment, the first body part may include a first contact surface and may have a multi-layered structure. In such embodiment, the second body part may include a second contact surface, may have a multi-layered structure, and may include a first signal line spaced apart from the second contact surface. In such embodiment, the connection part may include a third contact surface between the first contact surface and the second contact surface, and may connect the first body part and the second body part to each other. In such embodiments, by stacking a plurality of lines in the first body part and the second body part, respectively, the length of the first body part may be reduced.

In addition, according to embodiments of the invention, the display device may secure a space for arranging other components including the circuit board having the reduced length of the second body part.

BRIEF DESCRIPTION OF THE DRAWINGS

Illustrative, non-limiting embodiments will be more clearly understood from the following detailed description in conjunction with the accompanying drawings.

DETAILED DESCRIPTION

Figure 1:
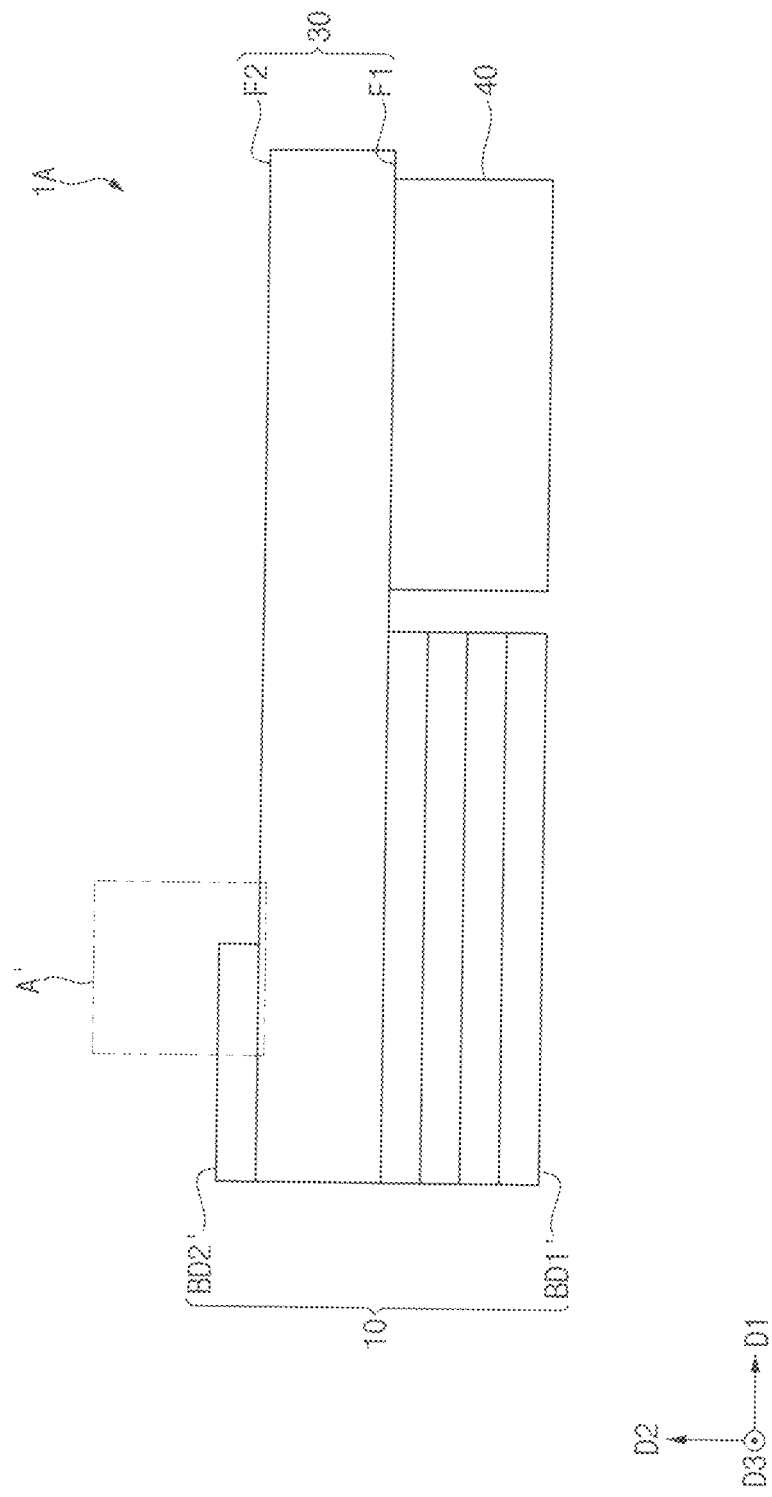
FIG. 1 is a cross-sectional view of a circuit board according to a comparative example.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the invention will be described in detail with reference to the accompanying drawings.

FIG. 1 is a cross-sectional view of a circuit board according to a comparative example.

Referring to FIG. 1, a circuit board 10 may include a first body part BD1' and a second body part BD2'. The circuit board 10 may be electrically connected to a display panel 30.

The first body part BD1' may be disposed on a first surface F1 of the display panel 30. The first body part BD1' may be disposed adjacent to a battery 40. That is, the first body part BD1' and the battery 40 included in the circuit board 10 may be disposed to be spaced apart from each other in a first direction D1. The first body part BD1' may have a multi-layered structure.

The second body part BD2' may be disposed on a second surface F2 of the display panel 30. Here, the second surface F2 of the display panel 30 may be defined as a surface for displaying an image. In addition, the second surface F2 may be opposite to the first surface F1, that is, the second surface F2 may face a direction opposite to a direction which the first surface F1 faces. That is, the second surface F2 and the first surface F1 may be disposed to be spaced apart from each other in a second direction D2. The second direction D2 may be a direction crossing the first direction D1. A line may be disposed in a single layer on the second body part BD2'.

The circuit board 10 may further include a connection part. The connection part may connect the first body part BD1' and the second body part BD2' to each other.

Figure 2:
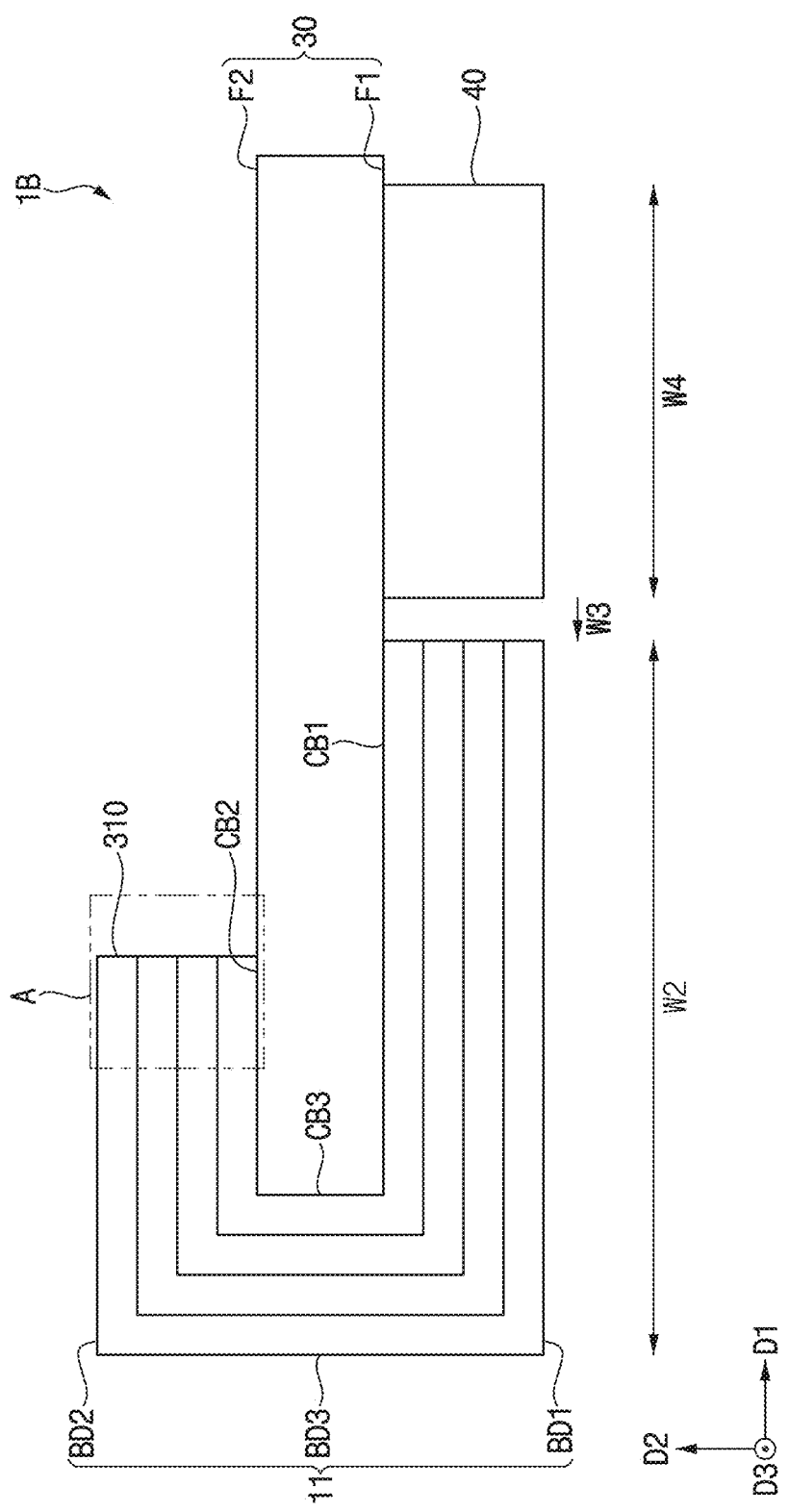
FIG. 2 a cross-sectional view illustrating a circuit board according to an embodiment of the invention.

FIG. 2 a cross-sectional view illustrating a circuit board according to an embodiment of the invention.

Referring to FIG. 2, a circuit board 11 may include a first body part BD1, a second body part BD2, and a connection part BD3. In an embodiment, the first body part BD1 may be disposed on a first surface F1 of a display panel 30, and the second body part BD1 may be disposed on a second surface F2 of the display panel 30, which is opposite to the first surface F1.

The first body part BD1 may include a first contact surface CB1. In addition, the first body part BD1 may have the multi-layered structure including a plurality of lines. The first body part BD1 may be disposed on a plane defined by the first direction D1 and a third direction D3. The third direction D3 may be a direction crossing each of the first direction D1 and the second direction D2. That is, the first body part BD1 may include the plurality of lines stacked in the second direction D2. Here, the second direction D2 may be a thickness direction of the display panel 30.

The second body part BD2 may include a second contact surface CB2. In addition, the second body part BD2 may have a multi-layered structure including a plurality of lines. The second body part BD2 may be disposed on the plane configured in the first direction D1 and the third direction D3. That is, the second body part BD2 may include the plurality of lines stacked in the second direction D2. In an embodiment, the second body part BD2 may include a first signal line (e.g., a first signal line 310 of FIG. 3) spaced apart from the second contact surface CB2. That is, the first signal line may not be adjacent to the second contact surface CB2. In such an embodiment, the first signal line may be a signal line, among the lines in the second body part BD2, disposed farthest from the second contact surface CB2 in the second direction D2.

The connection part BD3 may include a third contact surface CB3 between the first contact surface CB1 and the second contact surface CB2, that is, extending from the first contact surface CB1 to the second contact surface CB2. The connection part BD3 may connect the first body part BD1 and the second body part BD2 to each other. In an embodiment, the first, second and third contact surfaces CB1, CB2, and CB3 may extend continuously.

The connection part BD3 may be bent. In a state where the connection part BD3 is bent, the first contact surface CB1 and the second contact surface CB2 may face each other or disposed opposite to each other with the display panel 30 interposed therebetween.

The first body part BD1 and the battery 40 may be disposed on a same surface of the display panel 30. A length of the first surface F1 in the first direction D1 may be substantially equal to a sum of a length W2 of the first body part BD1 in the first direction D1 and a length W4 of the battery 40 in the first direction D1. In an alternative embodiment, the length of the first surface F1 in the first direction D1 may be substantially longer than the sum of the length W2 of the first body part BD1 in the first direction D1 and the length W4 of the battery in the first direction D1. In such an embodiment, the length W4 of the battery 40 in the first direction D1 may be limited within the length of the first surface F1 in the first direction D1 minus the length W2 of the first body part BD1 in the first direction D1.

The circuit board 11 according to an embodiment of the invention may be formed in the multi-layered structure in which the plurality of lines is stacked on the second body part BD2. Accordingly, the length W2 of the first body part BD1 may be shorter than a length of the circuit board according to the comparative example (e.g., the circuit board according to the comparative example of FIG. 1) by a predetermined length W3. Accordingly, the battery 40 having a length, which is relatively long by being allowed to increase by the predetermined length W3, and the circuit board 11 may be disposed on a same surface of the display panel 30 together.

Figure 3:
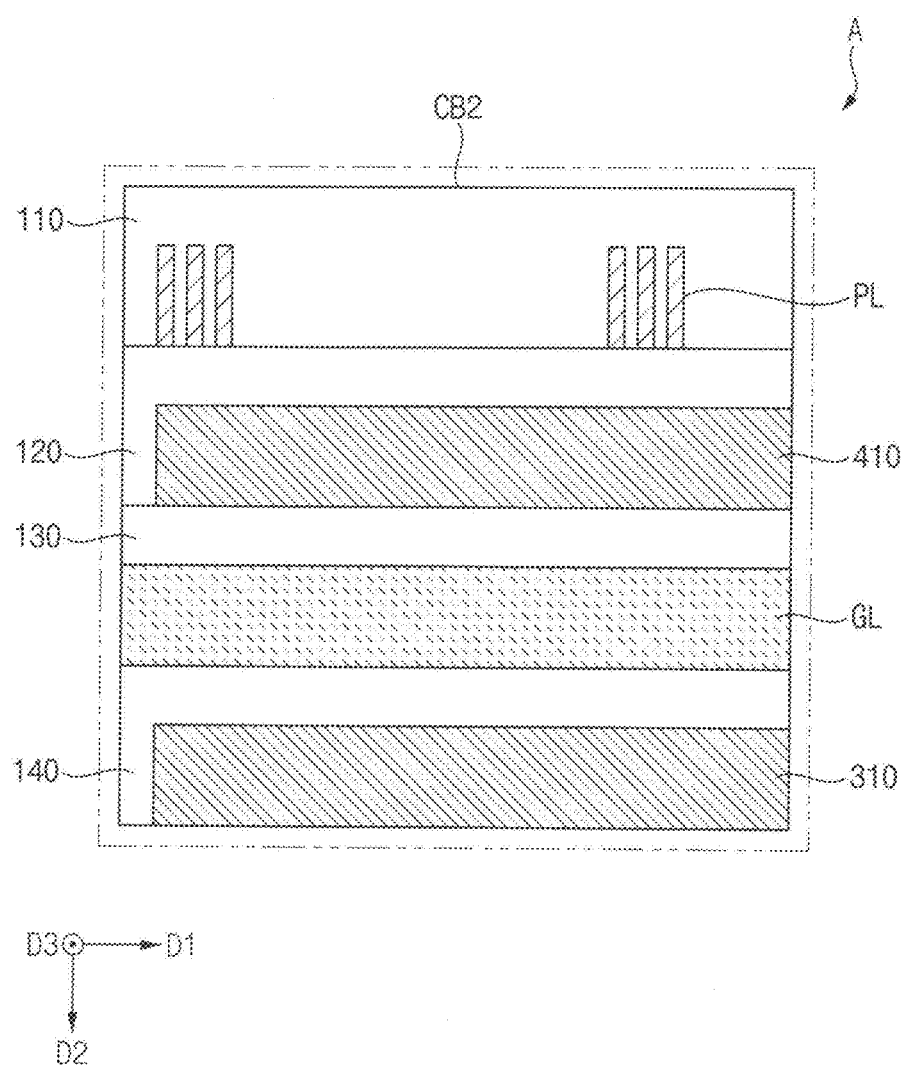
FIG. 3 is an enlarged cross-sectional view showing a multi-layered structure of a region A of FIG. 2.

FIG. 3 is an enlarged cross-sectional view showing a multi-layered structure of a region A of FIG. 2.

The region A may be a region where the display panel 30 and the circuit board 11 are bonded.

Referring to FIGS. 2 and 3, the second body part BD2 may include a panel signal line PL, a second signal line 410, a ground layer GL, and the first signal line 310.

In an embodiment, for example, the second body part BD2 may have the multi-layered structure in which the plurality of lines is stacked. In such an embodiment, the panel signal line PL, the second signal line 410, the ground layer GL, and the first signal line 310 may be sequentially stacked on the second surface F2 in the second direction D2.

The panel signal line PL may be disposed on the display panel 30. In an embodiment, the panel signal line PL may be disposed adjacent to the second contact surface CB2.

The second signal line 410 may be disposed on the panel signal line PL.

The ground layer GL may be disposed on the second signal line 410. The ground layer GL may be disposed between the second signal line 410 and the first signal line 310.

The panel signal line PL may receive a signal of the display panel 30. In an embodiment, the panel signal line PL may receive a voltage provided to the display panel 30. In an embodiment, a gate high voltage may be applied to the panel signal line PL.

The second signal line 410 may be an aggressor line. Since the second signal line 410 has a large voltage change, a voltage change of other lines which are disposed in different layers from the second signal line 410 may be affect by the voltage change of the second signal line 410. In an embodiment, the second signal line 410 may apply a frame start signal.

The ground layer GL may receive a ground signal. The ground layer GL may be disposed between the aggressor line that may affect the coupling of the other line and a victim line that may be affected by the coupling by the other line. The ground layer GL, which prevents coupling failure, will be described later with reference to FIGS. 4 and 5.

The first signal line 310 may be a line to which a constant voltage is applied. In an embodiment, the first signal line 310 may be a driving voltage line to which a driving voltage is applied. In an alternative embodiment, the first signal line 310 may be a common voltage line to which a common voltage is applied.

The first signal line 310 may be the victim line. In an embodiment, the coupling failure problem may occur in the first signal line 310. Coupling failure refers to a problem in which the voltage of the victim line is fluctuated by the aggressor line. In the structure in which the plurality of lines is sequentially stacked along the second direction D2, line-to-line coupling may occur due to electromagnetic coupling between the lines. When line-to-line coupling occurs, the device may malfunction or signal integrity may be significantly affected. In an embodiment, the aggressor line may be the second signal line 410. In an alternative embodiment, the aggressor line may be the panel signal line PL.

In an embodiment, the panel signal line PL may be the aggressor line or the victim line. The second signal line 410 may be the aggressor line and may be disposed adjacent to the second contact surface CB2. The first signal line 310 may be the victim line, and may be disposed furthest from the second contact surface CB2. The ground layer GL may be disposed between the first signal line 310 and the second signal line 410. Accordingly, when the circuit board 11 and the display panel 30 are bonded under high temperature and high pressure, insulating layers 110, 120, 130, and 140 are weakened, thereby preventing a defective coupling between lines.

The circuit board 11 may be formed in the order of a substrate, a signal line layer, a protective layer, and a corrosion prevention layer. Signal lines included in the signal line layer may perform various functions. In an embodiment, for example, the signal line layer may include a ground pattern, a power pattern, a signal pattern, or the like. Here, the signal of the signal pattern may mean various signals except for the signal of the ground pattern and the signal of the power pattern. In an embodiment, the signal of the signal pattern may be the gate high voltage signal. In an alternative embodiment, the signal of the signal pattern may be the frame start signal. In another alternative embodiment, the signal of the signal pattern may be a driving voltage signal or a common voltage signal. The signal line layer may include a conductive material. In an embodiment, for example, the signal line layer may include the conductive material such as silver, copper, copper alloy, or the like. In an embodiment, the signal line layer may include copper.

The circuit board 11 may further include insulating layers 110, 120, 130, and 140. The insulating layers 110, 120, 130, and 140 may include an insulating material. The insulating layers 110, 120, 130, and 140 may include an inorganic material or an organic material. In an embodiment, for example, the insulating layers 110, 120, 130, and 140 may include a thermosetting resin such as an epoxy resin, the thermoplastic resin such as polyimide, a solder resist ink, or the like. In an embodiment, the insulating layers 110, 120, 130, and 140 may include the solder resist ink. However, materials of the insulating layers 110, 120, 130, and 140 are not limited thereto. The insulating layers 110, 120, 130, and 140 may be inserted to surround the line layers.

The circuit board 11 may be a flexible printed circuit board (FPCB). The circuit board 11 may include or be made of a polyimide (PI) material and may have flexibility. Herein, embodiments where the circuit board 11 is the flexible printed circuit board, but the invention is not limited thereto.

In an embodiment, as described above, in the region where the display panel 30 and the circuit board 11 are bonded (e.g., the region A of FIG. 2), the plurality of lines may be defined by or formed of four layers. However, the plurality of lines stacked on the second surface F2 is not limited to four layers.

Figure 4:
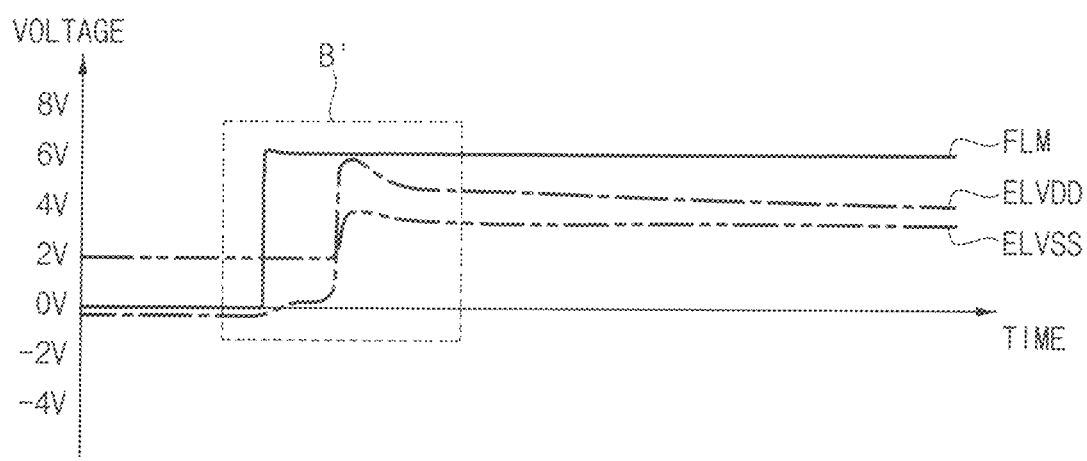
FIG. 4 is a graph illustrating voltage versus time showing a case where abnormal waveform appears when using the circuit board according to the comparative example.
Figure 5:
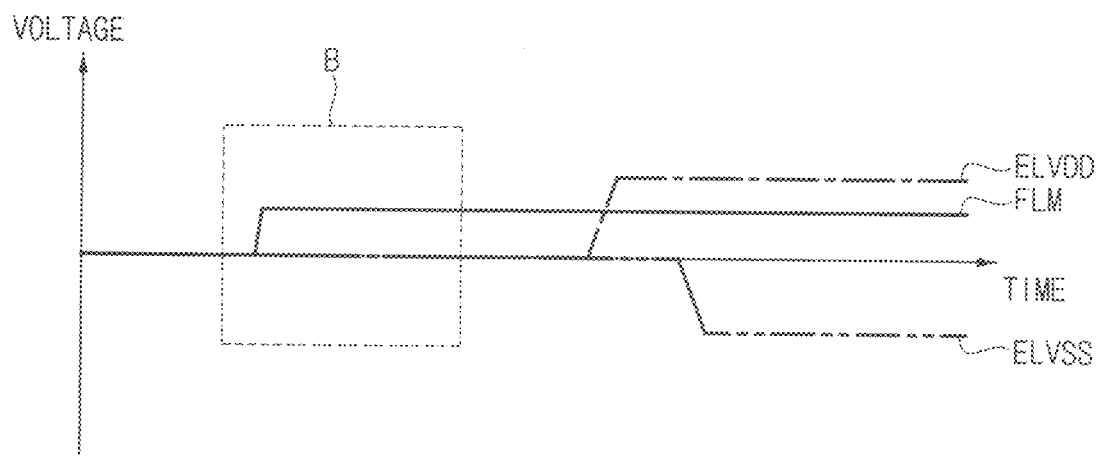
FIG. 5 is a graph illustrating voltage versus time showing a case where abnormal waveform is improved when using the circuit board according to the embodiment of the invention.

FIG. 4 is a graph illustrating voltage versus time showing a case where abnormal waveform appears when using the circuit board according to the comparative example. FIG. 5 is a graph illustrating voltage versus time showing a case where abnormal waveform is improved when using the circuit board according to the embodiment of the invention.

Referring to FIGS. 3 and 4, when the circuit board according to the comparative example is used, the abnormal waveform in which the voltage of the first signal line 310 is abnormally increased is observed. The circuit board according to the comparative example was manufactured by sequentially stacking the first signal line 310 and the second signal line 410 without the ground layer GL.

The first signal line 310 may be the victim line. In an embodiment, the victim line may be the driving voltage line to which a driving voltage ELVDD is applied. Alternatively, the victim line may be the common voltage line to which a common voltage ELVSS is applied. The driving voltage line or the common voltage line may be a line in which a voltage is desired to be maintained constant. The voltage of the driving voltage line or the common voltage line may fluctuate under the influence of lines disposed in different layers, that is disposed above or below thereof.

The second signal line 410 may be the aggressor line. In an embodiment, the aggressor line may be the frame start signal line to which the frame start signal FLM is applied. The frame start signal line having the large voltage change may affect lines disposed in other layers.

In an embodiment, the FLM line may be a line in which a voltage change of 5 volts (V) or more occurs. When a voltage of 6 V flows through the FLM line, the abnormal waveform is observed in the ELVDD or ELVSS line. (See B' in FIG. 4)

When a signal is applied to the FLM line, the voltage change of the ELVDD or ELVSS line may be about 10% or more. In an embodiment, after a voltage of about 15 V is changed in the FLM line, a voltage of 5 V should be applied to the ELVDD or ELVSS line, but a voltage of 6 V or more is applied to the ELVDD or ELVSS line. An abnormal operation occurred in the ELVDD or ELVSS line due to the voltage change of the FLM line.

The voltage change value may vary depending on the sensitivity of the victim line.

Referring to FIGS. 2, 3 and 5, when the circuit board 11 according to an embodiment of the invention is used, a normal waveform is observed. The circuit board 11 according to the embodiment of the invention was manufactured in the multi-layered structure in which the panel signal line PL, the second signal line 410, the ground layer GL, and the first signal line 310 are sequentially stacked. In an embodiment, as described above, the ground layer GL is further provided between the first signal line 310 and the second signal line 410 in the circuit board.

The second signal line 410 may be the aggressor line. The second signal line 410 may be disposed adjacent to the second contact surface CB2. In an embodiment, the aggressor line may be the frame start signal line to which the frame start signal FLM is applied. The frame start signal line having a large voltage change may affect the victim line.

The first signal line 310 may be the victim line. The first signal line 310 may be a signal line, among the lines in the second body part BD2, disposed farthest from the second contact surface CB2 in the second direction D2. In an embodiment, the victim line may be the driving voltage line or the common voltage line. The voltage of the driving voltage line or the common voltage line, which is desired to be maintained constant, may fluctuate greatly under the influence of the aggressor line.

The ground layer GL may be disposed between the first signal line 310 and the second signal line 410. In an embodiment, the ground layer GL may be disposed between the FLM line and ELVSS line.

Accordingly, as shown in the region B of FIG. 5, the circuit board 11 according to an embodiment of the invention may improve the coupling failure. When the circuit board 11 and the display panel 30 are bonded under high temperature and high pressure, the insulating layers 110, 120, 130, and 140 may become weak. However, the voltage of the ELVDD line or the ELVSS line may be constantly maintained by the ground layer GL without affected by the aggressor line. In such an embodiment, the circuit board 11 may prevent the coupling failure between the display panel 30 and a bonding part (e.g., the region A of FIG. 2) of the circuit board 11.

Figure 6:
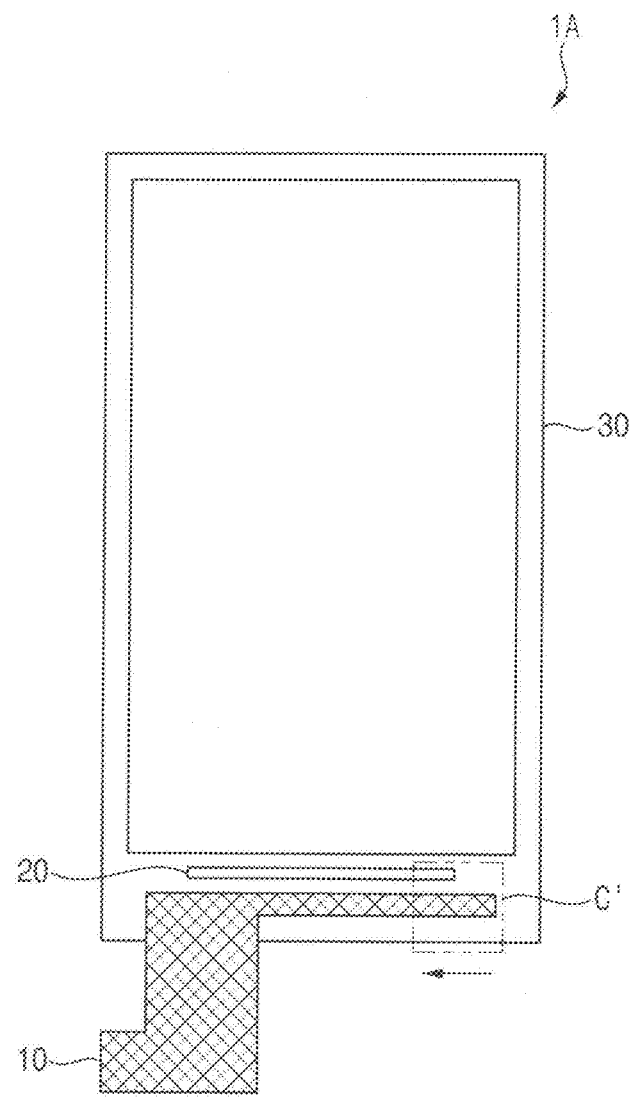
FIG. 6 is a plan view of a display device according to a comparative example.
Figure 6:
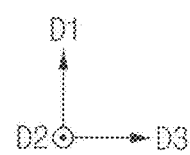
Figure 7:
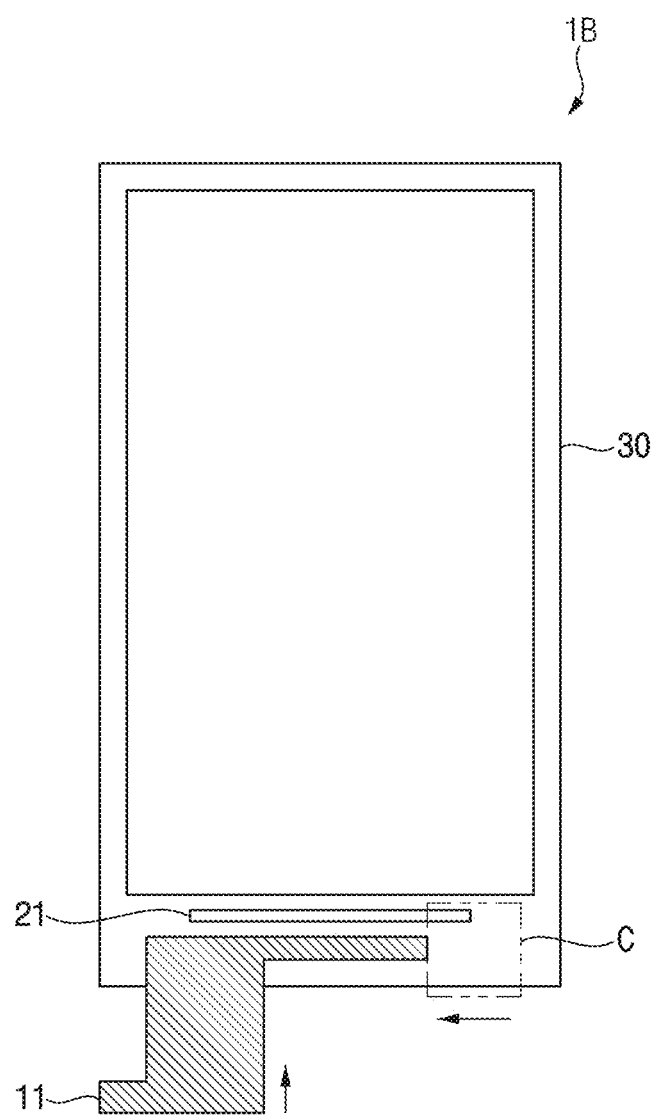
FIG. 7 is a plan view illustrating the display device according to an embodiment of the invention.

FIG. 6 is a plan view of a display device according to a comparative example. FIG. 7 is a plan view illustrating the display device according to an embodiment of the invention.

Referring to FIGS. 1 and 6, a display device 1A according to the comparative example may include the display panel 30 and the circuit board 10. Hereinafter, any repetitive detailed descriptions of the same or like elements as those of the circuit board 10 described above with reference to FIG. 1 will be omitted or simplified.

The display panel 30 may include the first surface F1 and the second surface F2. The second surface F2 may be opposite to the first surface F1 and may be defined as the surface for displaying an image.

One end portion (e.g., a portion in the region A' in FIG. 1) of the circuit board 10 may be bonded to pads disposed on one region of the display panel 30 to be electrically connected to the display panel 30. The circuit board 10 may be electrically connected to the display panel 30 through the pad part, or may be electrically connected to the display panel 30 through direct contact without the pad part.

The circuit board 10 may include a driving circuit 20. In an embodiment, the driving circuit 20 may be connected to the display panel 30 in a chip on plastic (COP) method. This is a method in which the driving circuit 20 and the display panel 30 made of a plastic material are directly connected to each other. However, the invention is not limited thereto, and alternatively, the driving circuit 20 may be connected to the display panel 30 in a chip on glass (COG) method. This is a method in which the driving circuit 20 and the display panel included a glass substrate are directly connected to each other. Alternatively, the driving circuit 20 may be connected to the display panel 30 in a chip on film (COP) method. This is a method in which the driving circuit 20 is implemented as an integrated circuit and mounted on the circuit board 10.

The other end portion of the circuit board 10 may further include a connector. The connector may electrically connect to a main board including a main processor.

The circuit board 10 may include the first body part BD1', the second body part BD2' and the connection part. In addition, the first body part BD1' may have the multi-layered structure including the plurality of lines. The second body part BD2' may have a single-layer structure. The circuit board 10 may transmit a signal received from the main board to a circuit, and may provide the signal from the circuit to the display panel 30.

The battery 40 may be disposed on the first surface F1 of the display panel 30. The battery 40 may be disposed adjacent to the first body part BD1' of the circuit board 10. The battery 40 may provide power to the display panel 30.

In the comparative example, the circuit board 10 may occupy half or more of the first surface F1 of the display panel 30. It may be desired to reduce the size of the circuit board 10 to secure a space for the battery 40. However, if the size of the circuit board 10 is reduced to secure the space for the battery 40, a line space may be insufficient.

Referring to FIGS. 2 and 7, a display device 1B according to an embodiment of the invention may include the display panel 30, a circuit board 11, and a driving circuit 21.

Hereinafter, any repetitive detailed descriptions of the same or like elements as those of the circuit board 11 described above with reference to FIGS. 2 and 6 will be omitted or simplified.

The display panel 30 may include the first surface F1 and the second surface F2. The second surface F2 may face the first surface F1 and may be defined as the surface for displaying an image.

One end portion (e.g., a portion in the region A in FIG. 2) of the circuit board 11 may be bonded to pads disposed on one region of the display panel 30 to be electrically connected to the display panel 30. The circuit board 10 may be electrically connected through the pad part, or may be electrically connected through direct contact without the pad part.

The circuit board 11 may include the driving circuit 21. The driving circuit 21 may be connected to the display panel 30 in a chip on plastic (COP) method.

The other end portion of the circuit board 11 may further include the connector. The connector may electrically connect to a main board including a main processor.

The circuit board 11 may be formed in the order of the substrate, the signal line layer, the protective layer, and the corrosion prevention layer. The circuit board 11 may include the first body part BD1, the second body part BD2, and the connection part BD3. As shown in FIG. 2, the signal line layers may include the plurality of lines. Each of the first body part BD1 and the second body part BD2 may include the signal line layers and may have the multi-layered structure.

The length of the first surface F1 in the first direction D1 may be substantially equal to the sum of the length W2 of the first body part BD1 in the first direction D1 and the length W4 of the battery 40 in the first direction D1. Alternatively, the length of the first surface F1 in the first direction D1 may be substantially longer than the sum of the length W2 of the first body part BD1 in the first direction D1 and the length W4 of the battery 40 in the first direction D1. That is, the length W4 of the battery 40 in the first direction D1 may be limited within the length of the first surface F1 in the first direction D1 minus the length W2 of the first body part BD1 in the first direction D1.

The circuit board 11 according to an embodiment of the invention may be formed in the multi-layered structure in which the plurality of lines is stacked on the second body part BD2. Accordingly, the length W2 of the first body part BD1 in the first direction D1 may be shorter than the length of the circuit board 10 according to the comparative example by the predetermined length W3. Accordingly, the battery 40 longer by the predetermined length W3 and the circuit board 11 may be disposed on the same plane of the display panel 30 together. In an embodiment, the predetermined length W3 may be approximately 1.6 millimeters (mm). That is, the display device 1B according to an embodiment of the invention may include a larger capacity battery than the display device 1A according to the comparative example.

In an embodiment, a length of the first body part BD1 in the third direction D3 may be shorter than a length of the first body part BD1 of the comparative example in the third direction D3 such that the size of the circuit board 11 may be further reduced. (See C' in FIG. 6 and C in FIG. 7).

Figure 8:
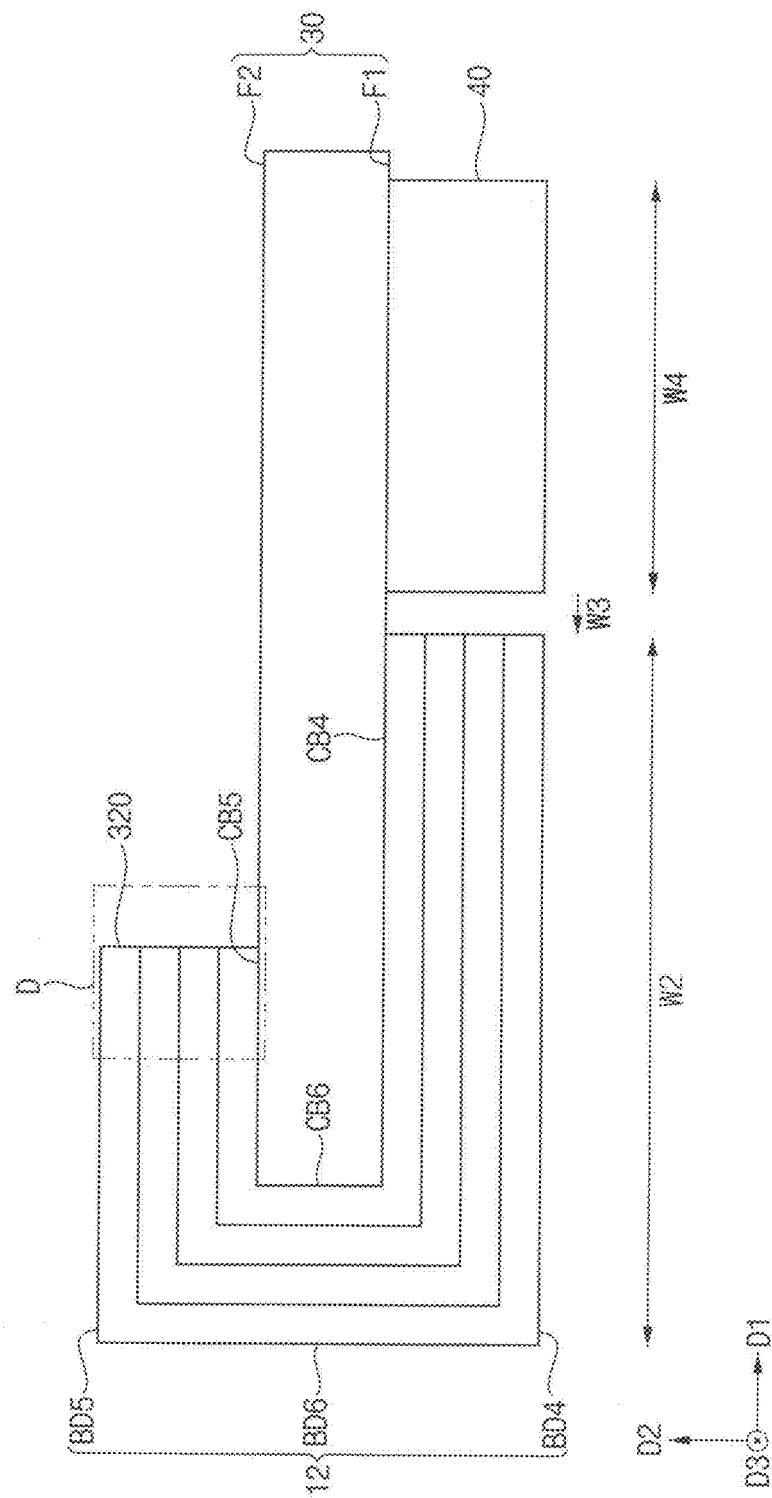
FIG. 8 is a cross-sectional view illustrating the circuit board according to an alternative embodiment of the invention.

FIG. 8 is a cross-sectional view illustrating the circuit board according to an alternative embodiment of the invention.

Hereinafter, any repetitive detailed descriptions of the same or like elements as those of the circuit board 11 and the display device 1B described above with reference to FIGS. 2 and 7 will be omitted or simplified.

Referring to FIG. 8, a circuit board 12 according to an embodiment of the invention may include a first body part BD4, a second body part BD5, and a connection part BD6.

The first body part BD4 may include a first contact surface CB4. In addition, the first body part BD4 may have a multi-layered structure including a plurality of lines. The first body part BD4 may be disposed on the plane defined by the first direction D1 and the third direction D3. That is, the first body part BD4 may include the plurality of lines stacked in the second direction D2.

The second body part BD5 may include a second contact surface CB5. In addition, the second body part BD5 may have a multi-layered structure including a plurality of lines. The second body part BD5 may be disposed on the plane defined by the first direction D1 and the third direction D3. That is, the second body part BD5 may include the plurality of lines stacked in the second direction D2. In an embodiment, the second body part BD5 may include a first signal line 320 spaced apart from the second contact surface CB5. That is, the first signal line 320 may not be adjacent to the second contact surface CB5. In such an embodiment, the first signal line 320 may be a signal line, among the lines in the second body part BD5, disposed farthest from the second contact surface CB5 among the lines in the second direction D2.

The connection part BD6 may include a third contact surface CB6 between the first contact surface CB4 and the second contact surface CB5. The connection part BD6 may connect the first body part BD4 and the second body part BD5. In an embodiment, the first, second and third contact surfaces CB4, CB5, and CB6 may extend continuously.

The connection part BD6 may be bent. In a state where the connection part BD6 is bent, the first contact surface CB4 and the second contact surface CB5 may face each other.

Figure 9:
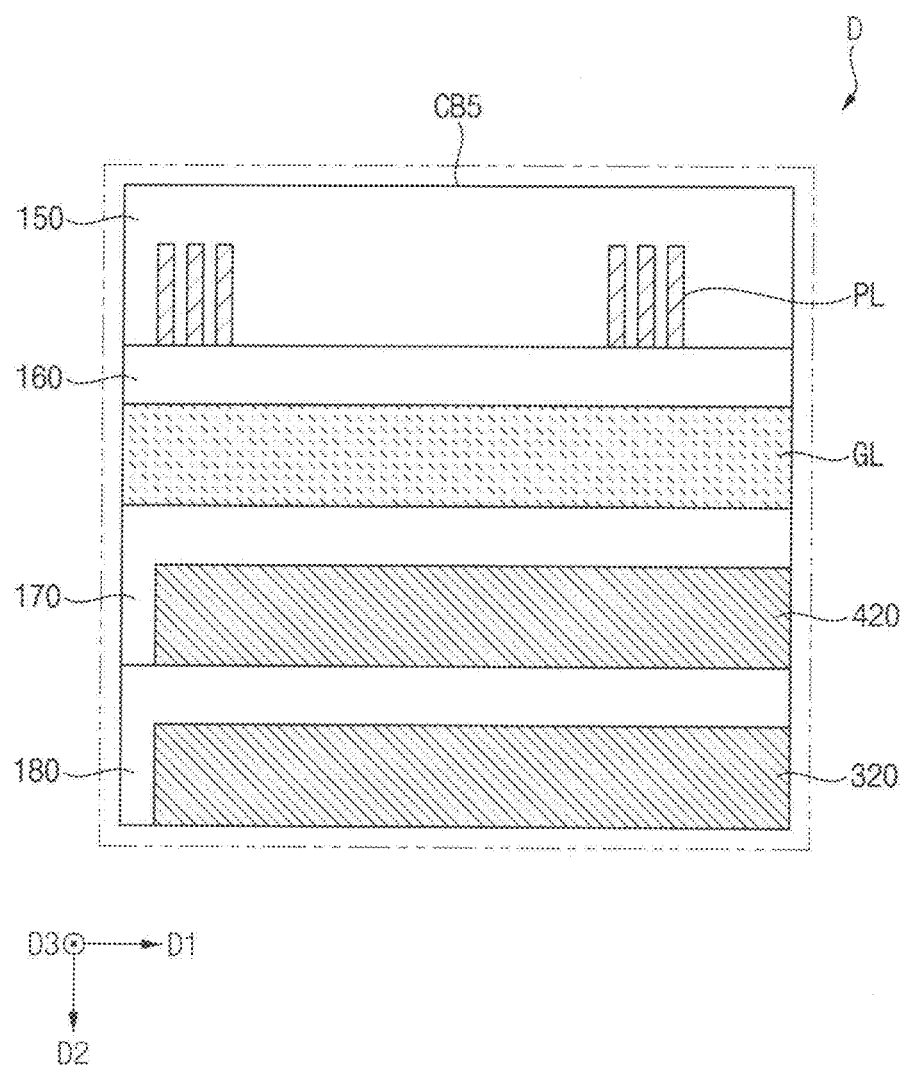
FIG. 9 is an enlarged cross-sectional view showing a multi-layered structure of a region D of FIG. 8.

FIG. 9 is an enlarged cross-sectional view showing a multi-layered structure of a region D of FIG. 8.

The region D may be a region where the display panel 30 and the circuit board 12 are bonded.

Hereinafter, any repetitive detailed descriptions of the same or like elements as those of the circuit board 11 and the display device 1B described above with reference to FIGS. 3 and 7 will be omitted or simplified.

Referring to FIGS. 8 and 9, the second body part BD5 of the circuit board 12 included in the display device may include the panel signal line PL, a second signal line 420, the ground layer GL, and a first signal line 320.

In an embodiment, for example, the second body part BD5 may have a multi-layered structure in which the plurality of lines is stacked. In an embodiment, the panel signal line PL, the second signal line 420, the ground layer GL, and the first signal line 320 may be sequentially stacked on the second surface F2 in the second direction D2.

The panel signal line PL may be disposed adjacent to the second contact surface CB5.

The panel signal line PL may receive the signal of the display panel 30. In an embodiment, the panel signal line PL may be the aggressor line. In such an embodiment, since the panel signal line PL has the large voltage change, a voltage change of other lines which are disposed in different layers from the panel signal line PL may be affect by the voltage change of the panel signal line PL. In an embodiment, the gate high voltage may be applied to the panel signal line PL.

Each of the first signal line 320 and the second signal line 420 may be disposed on the ground layer GL.

Each of the first signal line 320 and the second signal line 420 may be the victim line. In the structure in which the plurality of lines is sequentially stacked along the second direction D2, line-to-line coupling may occur due to electromagnetic coupling between the lines.

The first signal line 320 may be a line to which the constant voltage is applied. In an embodiment, the first signal line 320 may be the driving voltage line to which the driving voltage is applied. In an alternative embodiment, the first signal line 320 may be the common voltage line to which the common voltage is applied.

The second signal line 420 may be a line to which the constant voltage is applied. In an embodiment, the second signal line 420 may be the driving voltage line to which the driving voltage is applied. In an alternative embodiment, the second signal line 420 may be the common voltage line to which the common voltage is applied.

The ground layer GL may be disposed between the panel signal line PL and the second signal line 420.

In an embodiment, as described above, in the region where the display panel 30 and the circuit board 12 are bonded, the plurality of lines may be defined by or formed of four layers. However, the plurality of lines stacked on the second surface F2 is not limited to four layers.

In an embodiment, as described above, the circuit board 12 may be the flexible printed circuit board, but the invention is not limited thereto.

The display device according to an embodiment of the invention may include the display panel 30 and a circuit board.

In an embodiment, as shown in FIG. 8, the display panel 30 may include the first surface F1 and the second surface F2. The second surface F2 may be opposite to the first surface F1 and may be defined as the surface for displaying an image.

The circuit board 12 may be formed in the order of the substrate, the signal line layer, the protective layer, and the corrosion prevention layer. The circuit board 12 may include the first body part BD4, the second body part BD5, and the connection part BD6. In an embodiment, as shown in FIG. 8, each of the first body part BD4 and the second body part BD5 may have the multi-layered structure. The first surface F1 of the display panel 30 and the first body part BD4 of the circuit board 12 may be bonded at the first contact surface CB4. The second surface F2 of the display panel 30 and the second part BD5 of the circuit board 12 may be bonded at the second contact surface CB5. In a state where the connection part BD6 is bent, the first contact surface CB4 and the second contact surface CB5 may face each other.

The battery 40 may be disposed adjacent to the first body part BD4 of the circuit board 12 on the first surface F1 of the display panel 30 and may provide power to the display panel 30.

In an embodiment, as shown in FIG. 9, the second body part BD5 of the circuit board 12 included in the display device may include the panel signal line PL, the second signal line 420, the ground layer GL, and the first signal line 320.

As described above, in the circuit board 12 according to an embodiment of the invention, the aggressor line may be disposed adjacent to the region where the display panel and the circuit board 12 are bonded. The victim line may be a signal line, among the lines in the circuit board 12, disposed farthest from the region where the display panel 30 and the circuit board 12 are bonded. The ground layer GL may be disposed between the aggressor line and the victim line. Accordingly, the circuit board 12 and the display device including the circuit board 12 may prevent the coupling failure.

In addition, the display device including the circuit board 12 according to an embodiment of the invention may include the second body part BD5 having the multi-layered structure. Accordingly, the space in which battery 40 disposed adjacent to the circuit board 12 may be mounted may be further secured since one side portion of the circuit board 12 may be shortened.

The display devices 1A and 1B may be a liquid crystal display device, a field emission display device, a plasma display device, or an organic light emitting display device. However, these are listed as examples, and the types of the display devices 1A and 1B are not limited thereto.

Embodiments of the display device 1A and 1B illustrated in FIGS. 6 and 7 are flat panel displays. However, the invention is not limited thereto. Alternatively, the embodiments of the display device 1A and 1B may be a rollable display device, a foldable display device, or the like.

Embodiments of the disclosure may be applied to a display device and electronic device including the display device, for example, high-resolution smartphones, mobile phones, smart-pads, smart watches, tablet personal computers (PCs), in-vehicle navigation systems, televisions, computer monitors, notebook, computers, or the like.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A circuit board comprising: a first body part including a first contact surface and having a multi-layered structure; a second body part including a second contact surface, having a multi-layered structure, and including a first signal line spaced apart from the second contact surface; and a connection part including a third contact surface between the first contact surface and the second contact surface, and connecting the first body part and the second body part to each other, wherein the second body part further includes: a panel signal line adjacent to the second contact surface; a second signal line disposed on the panel signal line; and a ground layer disposed on the second signal line.

2. The circuit board of claim 1, wherein the second signal line is disposed between the panel signal line and the ground layer, and the ground layer is disposed between the first signal line and the second signal line.

3. The circuit board of claim 1, wherein the second signal line is a line, to which a frame start signal is applied.

4. The circuit board of claim 1, wherein the first signal line is a common voltage line, to which a common voltage is applied, or a driving voltage line, to which a driving voltage is applied.

5. The circuit board of claim 1, wherein in a state where the connection part is bent, the first contact surface and the second contact surface face each other.

6. A circuit board comprising: a first body part including a first contact surface and having a multi-layered structure; a second body part including a second contact surface, having a multi-layered structure, and including a first signal line spaced apart from the second contact surface; and a connection part including a third contact surface between the first contact surface and the second contact surface, and connecting the first body part and the second body part to each other, wherein the second body part further includes: a panel signal line adjacent to the second contact surface; a ground layer disposed on the panel signal line; and a second signal line disposed on the ground layer.

7. The circuit board of claim 6, wherein the ground layer is disposed between the panel signal line and the second signal line, and the second signal line is disposed between the first signal line and the ground layer.

8. The circuit board of claim 6, wherein the first signal line is a common voltage line, to which a common voltage is applied, or a driving voltage line, to which a driving voltage is applied.

9. The circuit board of claim 6, wherein the second signal line is a common voltage line, to which a common voltage is applied, or a driving voltage line, to which a driving voltage is applied.

10. The circuit board of claim 6, wherein in a state where the connection part is bent, the first contact surface and the second contact surface face each other.

11. A display device comprising: a display panel including a first surface and a second surface opposite to the first surface, wherein an image is displayed on the second surface; and a circuit board including: a first body part including a first contact surface in contact with the first surface of the display panel; a second body part including a second contact surface in contact with the second surface of the display panel, having a multi-layered structure, and including a first signal line spaced apart from the second contact surface; and a connection part including a third contact surface between the first contact surface and the second contact surface, and connecting the first body part and the second body part to each other, wherein the second body part further includes: a panel signal line adjacent to the second contact surface; a second signal line disposed on the panel signal line; and a ground layer disposed on the second signal line.

12. The display device of claim 11, wherein the second signal lines is disposed between the panel signal line and the ground layer, and the ground layer is disposed between the first signal line and the second signal line.

13. The display device of claim 11, wherein the second signal line is a line, to which a frame start signal is applied.

14. The display device of claim 11, wherein the first signal line is a common voltage line, to which a common voltage is applied, or a driving voltage line, to which a driving voltage is applied.

15. The display device of claim 11, further comprising: a battery disposed adjacent to the first body part of the circuit board on the first surface of the display panel, wherein the battery provides power to the display panel.

16. A display device comprising: a display panel including a first surface and a second surface opposite to the first surface, wherein an image is displayed on the second surface; and a circuit board including: a first body part including a first contact surface in contact with the first surface of the display panel; a second body part including a second contact surface in contact with the second surface of the display panel, having a multi-layered structure, and including a first signal line spaced apart from the second contact surface; and a connection part including a third contact surface between the first contact surface and the second contact surface, and connecting the first body part and the second body part to each other, wherein the second body part further includes: panel signal line adjacent to the second contact surface; a ground layer disposed between the panel signal line and the first signal line; and second signal line disposed between the ground layer and the first signal line.

17. The display device of claim 16, wherein the first signal line is a common voltage line, to which a common voltage is applied, or a driving voltage line, to which a driving voltage is applied.

18. The display device of claim 16, wherein the second signal line is a common voltage line, to which a common voltage is applied, or a driving voltage line, to which a driving voltage is applied.

19. The display device of claim 16, further comprising: a battery disposed adjacent to the first body part of the circuit board on the first surface of the display panel, wherein the battery provides power to the display panel.

20. The display device of claim 16, wherein the circuit board is a flexible printed circuit board.

* * * * *